United States Patent [19]
Bramley

[11] Patent Number: 6,025,876
[45] Date of Patent: Feb. 15, 2000

[54] DATA STREAM DECODING DEVICE

[75] Inventor: Richard Bramley, Grenoble, France

[73] Assignee: SGS-Thomson Microelectronics S.A., Saint Genis, France

[21] Appl. No.: 08/663,026

[22] Filed: Jun. 7, 1996

[30] Foreign Application Priority Data

Jun. 9, 1995 [FR] France .................................. 95 06864

[51] Int. Cl.⁷ .................................................. H04N 7/30
[52] U.S. Cl. .......................... 348/390; 348/384; 348/404
[58] Field of Search .................................. 348/390, 394, 348/395, 392, 719, 403, 384, 404; H04N 7/30

[56] References Cited

U.S. PATENT DOCUMENTS

| | | | |
|---|---|---|---|
| 5,253,053 | 10/1993 | Chu et al. ................................. | 348/390 |
| 5,400,075 | 3/1995 | Savatier .................................. | 348/390 |
| 5,469,212 | 11/1995 | Lee ......................................... | 348/392 |
| 5,515,437 | 5/1996 | Katta et al. ............................. | 348/403 |
| 5,570,197 | 10/1996 | Boon ....................................... | 348/390 |
| 5,579,121 | 11/1996 | Ohta et al. .............................. | 348/390 |
| 5,581,310 | 12/1996 | Vinekar et al. ......................... | 348/719 |
| 5,606,370 | 2/1997 | Moon ..................................... | 348/390 |

FOREIGN PATENT DOCUMENTS

| | | |
|---|---|---|
| 0503956 | 9/1992 | European Pat. Off. . |
| 0572263 | 12/1993 | European Pat. Off. . |

OTHER PUBLICATIONS

Elettronic Oggi, Jun. 30, 1995, Italy, No. 201, ISSN 0391–6391, pp. 69, 70, 72–73, Zannoli, S., "An MPEG–1 development kit."

SMPTE Journal, Feb. 1995, USA, vol. 104, No. 2, ISSN 0036–1682, pp. 62–72, Stojancic, M. M., et al., "Architecture and VLSI implementation of the MPEG–2:MP@ML video decoding process."

ICASSP–92: 1992 IEEE International Conference on Acoustics, Speech and Signal Porcessing (CAT. No. 92CH3103–9), San Francisco, CA, USA, Mar. 23–26, 1992, ISBN 0–7803–0532–9, 1992, New York, NY, USA, IEEE, USA, pp. 661–664 vol. 5, Tamitani I et al., "An encoder/decoder chip set for the MPEG video standard."

*Primary Examiner*—Brian L. Casler
*Assistant Examiner*—LuAnne P. Din
*Attorney, Agent, or Firm*—Wolf, Greenfield & Sacks, P.C.

[57] ABSTRACT

A device for decoding a data stream representing moving pictures encoded according to the MPEG standard in which a logical unit receives from an offset stage data containing the maximum number of bits in a variable length code returns the length of each decoded code to the offset stage, and produces a decoded value of each code. The logical unit includes a controller which controls at least two separate processing units, of which a first processing unit extracts the code length and addresses it to the offset stage, and a second processing unit decodes the codes.

21 Claims, 2 Drawing Sheets

DATA STREAM DECODING DEVICE

BACKGROUND AND SUMMARY OF THE INVENTION

This invention concerns a device for decoding a data stream representing moving pictures encoded according to the MPEG standard.

MPEG standards define the conditions under which moving pictures are encoded and decoded.

Digitized picture transmission and storage techniques can significantly improve the quality of the pictures finally obtained, compared with analog transmission. These techniques also have a wider range of applications.

However, direct transmission and storage of moving digitized pictures requires an extremely high information throughput, which in practice makes it necessary to compress and encode these pictures.

Digitized pictures are thus encoded before transmission in order to reduce the quantity of information representing them, and are then decoded after transmission.

Obviously, encoding and decoding techniques are essential for the quality of the final pictures, and it became necessary to standardize them so that the various equipment using these techniques would be compatible.

Thus a group of Experts (the Moving Picture Expert Group—MPEG) developed ISO standard 11172 and ISO IEC standard 13818.

These two standards are often referred to as MPEG1 and MPEG2, and define encoding and decoding conditions for moving pictures, possibly associated with a sound signal, that can be used equally well for the storage and reproduction of pictures, and for their transmission.

Therefore this MPEG standard may be used for the storage of pictures on compact disks, interactive compact disks, magnetic tapes, for the transmission of pictures through LANs or telephone lines, and the transmission of television pictures by radio communications The standard completely defining this technique in detail can be obtained from standardization organizations, and reference should be made to it for a detailed description.

Data compression used according to the MPEG standard may be processing several ways.

Consecutive pictures are firstly collected, in order to form a group of pictures forming a sequence. Therefore a sequence is subdivided into groups of pictures.

Each picture is divided into strips, each strip itself being broken down into macroblocks that form the basic element used to apply a movement compensation and if necessary to change the quantification scale.

Macroblocks are formed from a 16×16 matrix of picture elements (pixels).

Each macroblock is usually divided into six blocks, the first four blocks containing brightness information, and the other two blocks each containing color information.

Each of these six blocks is defined as being a matrix of 8×8 picture elements (pixels).

Different types of pictures are defined inside each sequence in order to reduce the quantity of information to be stored or transmitted, making use of similarities between information contained in the different pictures in the same sequence.

I (Intraframe) pictures are encoded without reference to another picture.

P (Predicted) pictures are deduced from the previously rebuilt I or P picture.

B (Bi-directional frames) pictures are deduced from two rebuilt I and P or P and P pictures, usually the one immediately before and the one immediately after.

It should be emphasized here that in general, the order in which pictures in a sequence are transmitted is not usually the same as the order in which they are presented during acquisition or reproduction. They are in the order of decoding.

A Discrete Cosine Transformation (DCT) is applied to these blocks.

This DCT transformation transforms spatial blocks defined as mentioned above in a 8×8 pixel matrix, into temporal blocks formed from another 8×8 matrix of space frequencies.

It has been shown that the continuous background coefficient (DC) in the 8×8 matrix of the temporal block, placed at the top left of the matrix, is much more important for the visual impression obtained than the other components corresponding to different frequencies.

More precisely, the eye is less sensitive for higher frequencies.

This is why the frequency levels are quantified, particularly at higher frequencies. This quantification is done by an algorithm which is not imposed by the standard, and which includes a quantification and Variable Length Coding (VLC) operation.

The matrix in the frequency domain obtained by the DCT transformation is then processed by a so-called "quantification matrix" which is used to divide each of the terms in the time domain matrix by a value that depends on its position, taking into account the fact that the weight of the various frequencies represented by these coefficients is variable.

After each value has been rounded to the nearest integer value, the result of this operation gives a large number of coefficients equal to zero.

It should be emphasized that the quantification value of the background coefficient (DC) is constant for intra macroblocks, for example equal to 8. Non-zero frequency coefficients are then encoded by means of zigzag scanning with reference to a Huffman's table, assigning a variable length coded value to each coefficient in the matrix, and reducing the volume of information.

Preferably, coefficients representing the continuous background are transmitted after quantification and furthermore the quantification matrix is optimized so that the volume of information is less than a predetermined level matching storage or transmission capabilities, without excessively deteriorating the quality of the transmitted information.

Type I pictures are encoded without the use of a movement vector.

However, type P and B pictures use movement vectors, at least for some of the macroblocks contained in them, in order to increase the coding efficiency and indicating the part of the reference picture(s) from which a specific macroblock in the picture considered should be determined.

The search for the movement vector is optimized during encoding, and is itself encoded using the DPCM technique which makes the best use of the correlation between movement vectors from different macroblocks in the same picture. Finally, a variable length coding (VLC) is applied to them.

All information concerning an encoded sequence makes up the bitstream that will be either recorded or transmitted.

This type of bitstream starts with a sequence header containing a given amount of information, and parameters whose values remain constant for the entire sequence.

Similarly, since the sequence is broken down into groups of pictures, each of these groups is preceded by a group header, and data representing each picture are preceded by a picture header.

Therefore a reception system complying with the MPEG standard receives a stream of data or digital information in the form of variable length codes representing pictures. This data stream also includes code length tables, decoding tables for variable length codes that will be used by the reception system to transform the data stream into the sequence of moving pictures that was initially encoded.

As we have already seen, the data stream also includes movement vectors.

In previously known devices, a processing unit receives a data stream from a data offset stage and itself extracts the length of each code, and decodes it.

Due to the information stream to be processed to produce pictures with an adequate spatial definition and a sufficiently large number to give an impression of continuous movement, the various decoding operations must be carried out at a very high speed.

The inventors demonstrated that code length extraction and decoding operations carried out by the processing unit, as described above, are an important step that could limit the processing speed of the decoding assembly.

The purpose of this invention is to provide an alternative device in order to increase the speed at which these operations are carried out, without it being necessary to use large and therefore expensive means.

Consequently, the invention concerns a device for decoding a data stream representing moving pictures encoded according to the MPEG standard in which a logical unit receives data containing the maximum number of bits in a variable length code from an offset stage, returns the length of each decoded code to the offset stage, and produces a decoded value of each code.

According to the invention, this decoding device includes a controller controlling at least two separate processing units, in which a first processing unit extracts the code length and addresses it to the offset stage, and a second processing unit decodes the codes, the processing units being controlled by the logical unit.

According to the different preferred embodiments, this decoding device has the following characteristics which may be combined:

the data stream containing a code length table, the controller extracts parameters from the data stream defining the code length table and addresses this table to the first processing unit;

the data flow containing a variable length codes decoding table, the controller extracts parameters defining the variable length codes decoding table from the data stream, and addresses this table to the second processing unit;

the data stream containing movement vectors, there is a third processing unit to decode movement vectors;

each processing unit is controlled by the controller in a master/slave relation, the controller addressing a start command to control processing in a processing unit, and the processing unit returning an end signal to the controller when the processing is terminated;

each processing unit receives data from the offset stage at the same time as the controller receives the same data;

the controller controls transmission of signals after decoding.

BRIEF DESCRIPTION OF THE DRAWING

The invention will be described in detail with reference to the appended drawings, in which.

DETAILED DESCRIPTION

Figure 1:
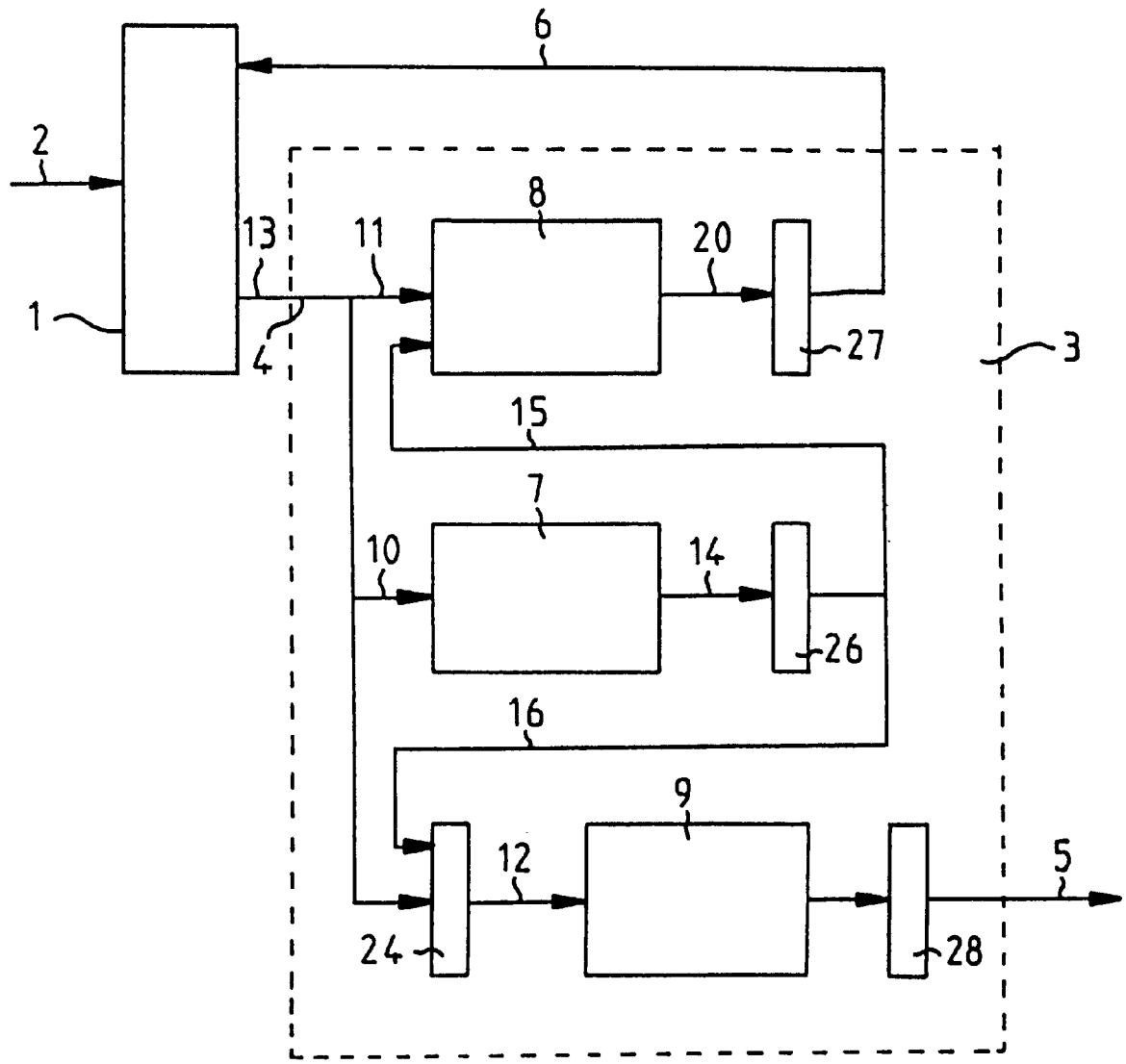
FIG. 1 shows a block diagram showing a first embodiment of the device according to the invention.

The offset stage 1 receives a data stream 2 representing moving pictures encoded according to one of the MPEG standards.

Therefore the data stream consists of a succession of sequences each containing headers carrying miscellaneous information and data directly representing pictures in coded form.

The decoding device 3 receives information 4 from the offset stage and transmits values of decoded data 5 to the next stage in the picture display device, and information 6 containing the length of each decoded code, addressed to the offset stage to allow it to access and process the next code.

The decoding device 3 includes a controller 7, a first processing unit 8 designed to extract the code length and a second processing unit 9 producing the decoded value of each code. 26, 27, 28 are timing flip-flops placed at their outputs.

Inputs 10, 11 and 12 to controller 7 and the two processing units 8 and 9 respectively, are connected to output 13 from the offset stage, and therefore receive signals representing each code.

The controller 7 is programmed to be able to recognize the various signal types making up the MPEG data flow and it is connected through its output 14 to control inputs 15 and 16 respectively of processing units that can thus be controlled by it. Input 16 is connected to an "And" circuit 24. Processing units 8 and 9 each have a memory capacity allowing them to store firstly a code length table concerning the first processing unit which has the function of extracting the code length, and secondly a variable length codes decoding table for the second processing unit 9 designed to perform this decoding.

When controller 7 recognizes this type of table in the signals received from the offset stage 1, it updates them and addresses them to the required processing units 8, 9.

The processing unit 8 can thus extract the code length and address the offset command through its output 20 to offset stage 1 necessary to access the next code, while processing unit 9 performs the decoding.

Thus the various functions in the decoding device are distributed between the controller 7 itself, the length processing unit 8 and the decoding processing unit 9, which means that this device can work extremely quickly.

Figure 2:
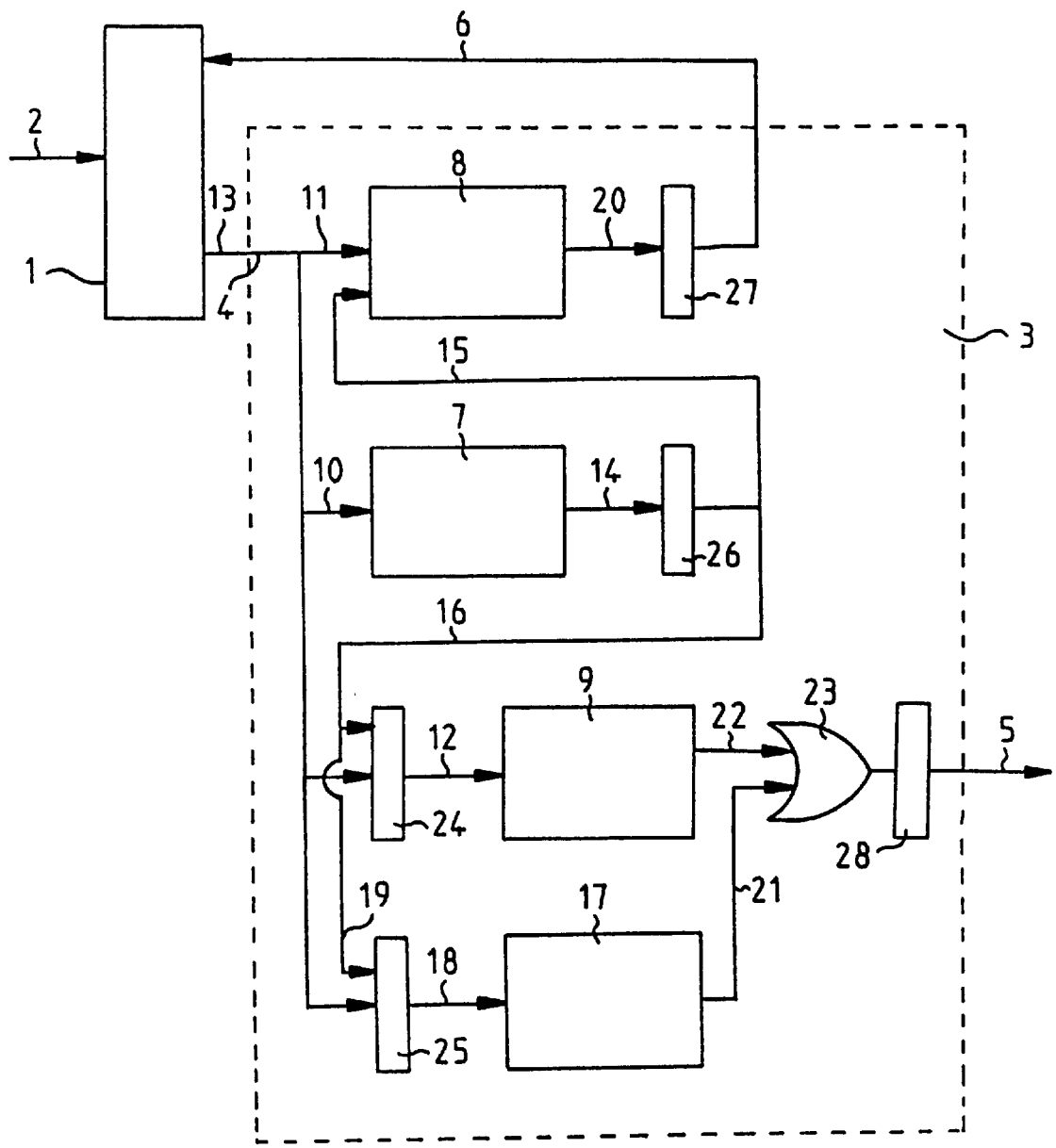
FIG. 2 shows a block diagram of a second embodiment of the invention.

Advantageously, as shown in FIG. 2, the decoding device contains an additional processing unit 17 that also receives codes on its input 18 from "And" circuit 25 controlled by controller 7 that is connected to its control input 19. The output from an "Or" circuit 23, the inputs of which are connected to output 21 on unit 17 and output 22 on unit 9 respectively, then forms the output 5 from the decoding device. This processing unit 17 is intended for processing movement vectors. It is also controlled by controller 7 from which it receives movement vector decoding tables.

Each processing unit 8, 9, 17 is advantageously controlled by controller 7 in a master/slave relation. Controller 7 addresses a start command to each processing unit when it recognizes a code intended for it, and the processing unit returns an end signal to the controller when it has terminated its operation.

In a preferred embodiment, the controller 7 also controls a storage unit and thus controls signals after decoding.

What is claimed is:

1. A device for decoding a data stream representing moving pictures encoded according to the MPEG standard in which a logical unit receives from an offset stage data containing the maximum number of bits in a variable length code, returns the length of each decoded code to the offset stage, and produces a decoded value of each code, said logical unit comprising:
    a first processing unit configured to extract the code length and address the code length to the offset stage;
    a second processing unit configured to decode the codes while the first processing unit is extracting the code length; and a controller configured to control the two processing units.

2. A decoding device according to claim 1, wherein the data stream contains a code length table, and wherein the controller is configured to extract from the data stream parameters defining the code length table and to addresses the code length table to the first processing unit.

3. A decoding device according to claim 1, wherein the data stream contains a variable length codes decoding table, and wherein the controller is configured to extract from the data stream parameters defining the variable length codes decoding table and addresses the variable length codes decoding table to the second processing unit.

4. A decoding device according to claim 1, wherein the data stream contains movement vectors, and wherein the logical unit further comprises a third processing unit configured to decode movement vectors.

5. A decoding device according to claim 1, wherein the controller is configured to control each processing unit in a master/slave relationship, and wherein the controller is configured to address a start command to control processing in one of the processing units, and the processing unit is configured to returning an end signal to the controller when the processing is terminated.

6. A decoding device according to claim 1, wherein each processing unit is configured to receive data from the offset stage at the same time the controller receives the same data.

7. A decoding device according to claim 1, wherein the controller is configured to control transmission of signals after decoding.

8. A system for decoding a data stream according to the MPEG standard, comprising:
    an offset stage connected to receive an input data stream and to produce an encoded data containing a maximum number of bits in a variable length code;
    a first processing unit connected to receive said encoded data, extract the code length of said encoded data, and return said code length to said offset stage;
    a second processing unit connected to receive said encoded data, to decode said encoded data while said first processing unit extracts the code length of said encoded data, and to produce a decoded data;
    a controller connected to receive said encoded data and to control said first and second processing units according to MPEG standard codes in said encoded data.

9. A system for decoding a data stream according to the MPEG standard, comprising:
    an offset stage connected to receive an input data stream and to produce an encoded data containing a maximum number of bits in a variable length code;
    a first processing unit having a local memory for storing a code length table, and being connected to receive said encoded data, extract the code length of said encoded data, and return said code length to said offset stage;
    a controller connected to receive said encoded data and to control said first processing unit and a second processing unit according to MPEG standard codes in said encoded data;
    a logic circuit connected to receive said encoded data, to receive a first control signal from said controller, and to produce a second control signal;
    said second processing unit having a local memory for storing a variable length codes decoding table, and being connected to receive said second control signal, to decode said second control signal while said first processing unit is extracting the code length of said encoded data, and to produce a decoded data.

10. The system of claim 8, wherein said data stream comprises a code length table, and wherein the controller is configured to extract parameters defining a code length table from the encoded data and to pass the code length table to said first processing unit.

11. The system of claim 8, wherein said data stream comprises a code length table, and wherein the controller is configured to extract parameters defining a variable length codes decoding table from the encoded data and to pass the variable length codes decoding table to said second processing unit.

12. The system of claim 8, further comprising a third processing unit configured to decode movement vectors.

13. The system of claim 8, wherein said controller controls said first and second processors in a master-slave relation.

14. The system of claim 8, wherein said first processing unit, said second processing unit, and said controller receive said encoded data at the same time.

15. The system of claim 8, wherein said controller is configured to control the transmission of said decoded data.

16. The system of claim 9, wherein said data stream comprises a code length table, and wherein the controller is configured to extract parameters defining a code length table from the encoded data and to pass the code length table to said first processing unit.

17. The system of claim 9, wherein said data stream comprises a code length table, and wherein the controller is configured to extract parameters defining a variable length codes decoding table from the encoded data and to pass the variable length codes decoding table to said second processing unit.

18. The system of claim 9, further comprising a third processing unit configured to decode movement vectors.

19. The system of claim 9, wherein said controller is configured to control said first and second processors in a master-slave relation.

20. The system of claim 9, wherein said first processing unit, said second processing unit, and said controller are each configured to receive said encoded data at the same time.

21. The system of claim 9, wherein said controller is configured to control the transmission of said decoded data.

* * * * *